US008115393B2

(12) United States Patent
Neal et al.

(10) Patent No.: US 8,115,393 B2
(45) Date of Patent: Feb. 14, 2012

(54) LED TUBULAR LIGHTING FIXTURE

(76) Inventors: Andrew T. Neal, Salt Point, NY (US); Timothy John Porter, Herefordshire (GB)

( * ) Notice: Subject to any disclaimer, the term of this patent is extended or adjusted under 35 U.S.C. 154(b) by 445 days.

(21) Appl. No.: 12/351,569

(22) Filed: Jan. 9, 2009

(65) Prior Publication Data

US 2010/0176724 A1 Jul. 15, 2010

(51) Int. Cl.
*H01L 27/00* (2006.01)

(52) U.S. Cl. .......................... 315/36; 315/291; 315/294

(58) Field of Classification Search .................... 315/32, 315/34, 112–115, 36; 362/800, 313, 231, 362/235, 218, 219, 240, 249.01, 294, 545; 361/782, 783

See application file for complete search history.

(56) References Cited

U.S. PATENT DOCUMENTS

| | | | | |
|---|---|---|---|---|
| 4,761,720 | A | 8/1988 | Solow | |
| 5,222,799 | A | 6/1993 | Sears et al. | |
| 6,283,612 | B1 * | 9/2001 | Hunter | 362/240 |
| 6,696,784 | B2 * | 2/2004 | Yoshida et al. | 313/498 |
| 7,165,863 | B1 | 1/2007 | Thomas et al. | |
| 7,175,303 | B2 | 2/2007 | Kovacik et al. | |
| 7,307,391 | B2 * | 12/2007 | Shan | 315/291 |
| 7,365,991 | B2 * | 4/2008 | Aldrich et al. | 361/783 |
| 7,441,922 | B2 | 10/2008 | Huang et al. | |
| 2002/0149933 | A1 | 10/2002 | Archer et al. | |
| 2003/0038727 | A1 | 2/2003 | Tatar | |
| 2006/0202850 | A1 | 9/2006 | Hefright et al. | |
| 2007/0064428 | A1 | 3/2007 | Beauchamp | |
| 2007/0133202 | A1 | 6/2007 | Huang et al. | |
| 2007/0165405 | A1 * | 7/2007 | Chen | 362/253 |
| 2007/0273290 | A1 * | 11/2007 | Ashdown et al. | 315/113 |
| 2007/0291503 | A1 | 12/2007 | Friedrich et al. | |
| 2008/0089064 | A1 | 4/2008 | Wang | |
| 2008/0151535 | A1 * | 6/2008 | de Castris | 362/220 |
| 2009/0219713 | A1 * | 9/2009 | Siemiet et al. | 362/218 |

FOREIGN PATENT DOCUMENTS

| | | | |
|---|---|---|---|
| JP | 08162677 | A | 6/1996 |
| JP | 2002141555 | A | 5/2002 |

OTHER PUBLICATIONS

International Search Report and Written Opinion for corresponding PCT application No. PCT/US2010/020318 mailed Jul. 29, 2010.

* cited by examiner

*Primary Examiner* — Shawki S Ismail
*Assistant Examiner* — Crystal L Hammond
(74) *Attorney, Agent, or Firm* — Joseph L. Spiegel

(57) ABSTRACT

A tubular LED lighting fixture comprises: a heat sink shell; a printed circuit board supported on the shell and having an upper surface and a bottom surface, longitudinally extending laterally spaced wiring on the upper and bottom surfaces, and, transverse heat pipes running through the printed circuit board; a plurality of LEDs connected in series across the laterally spaced upper surface wiring and spacedly mounted along the printed circuit board; a high frequency electronic driver mounted in the shell and connected in series with the LEDs; voltage limiting devices mounted across the laterally spaced bottom surface wiring of the printed circuit board and in parallel with the LEDs; a lens bonded to the shell covering the printed circuit board for directing and delivering light from the LEDs, the shell and lens forming a tube for enclosing the LED bearing printed circuit board; the tube so formed having sealed ends to form a watertight fixture; and, input wires extending from the high frequency electronic driver through at least one of the tube sealed ends.

12 Claims, 10 Drawing Sheets

LED TUBULAR LIGHTING FIXTURE

BACKGROUND OF THE INVENTION

1. Field of the Invention

This invention relates, in general, to LED lighting, and, in particular to a lighting system that includes tubular LED lighting fixtures that may be used for lighting in a variety of applications.

2. Description of the Prior Art

The prior art is replete with LED lighting fixtures and assemblies. Examples of same may be found in: Solow, U.S. Pat. No. 4,761,720; Sears, et al., U.S. Pat. No. 5,222,799; Hunter, U.S. Pat. No. 6,283,612; Archer, et al. US2002/0149933; Hefright, et al., 2006/0202850; Tatar, US2003/0038727; Thomas, et al., U.S. Pat. No. 7,165,863; Beauchamp, US2007/0064428; Friedrich, et al., US2007/0291503; Wang, US2008/0089064; and, Huang, et al., U.S. Pat. No. 7,441,922.

The prior art fails to provide a truly usable LED fixture and assembly that will permit one to incorporate same in existing conduit based wiring, to become both general as well as emergency lighting, and allow for the electrical supply to come from a variety of alternate sources.

SUMMARY

A primary object of the present invention is the provision of a tubular LED lighting fixture that is applicable for use in multiple applications.

These and other objects, features and advantages are accomplished in accordance with the teachings of the present invention, one illustrative embodiment of which comprises: a tubular LED lighting fixture comprising: a heat sink shell; a printed circuit board supported on the shell and having an upper surface and a bottom surface, longitudinally extending laterally spaced wiring on the upper and bottom surfaces, and, transverse heat pipes running through the printed circuit board; a plurality of LEDs connected in series across the laterally spaced upper surface wiring and spacedly mounted along the printed circuit board; a high frequency electronic driver mounted in the shell and connected in series with the LEDs; voltage limiting devices mounted across the laterally spaced bottom surface wiring of the printed circuit board and in parallel with the LEDs; an on-off switch for the fixture; a lens bonded to the shell, covering the printed circuit board for directing and delivering light from the LEDs, the shell and lens forming a tube for enclosing the LED bearing printed circuit board; the tube so formed having sealed ends to form a watertight fixture; and, input wires extending from the high frequency electronic driver through at least one of the tube sealed ends.

BRIEF DESCRIPTION OF THE DRAWING

Other objects, features and advantages of the present invention will be apparent from the following detailed description and accompany drawing, wherein.

DETAILED DESCRIPTION

Figure 1:
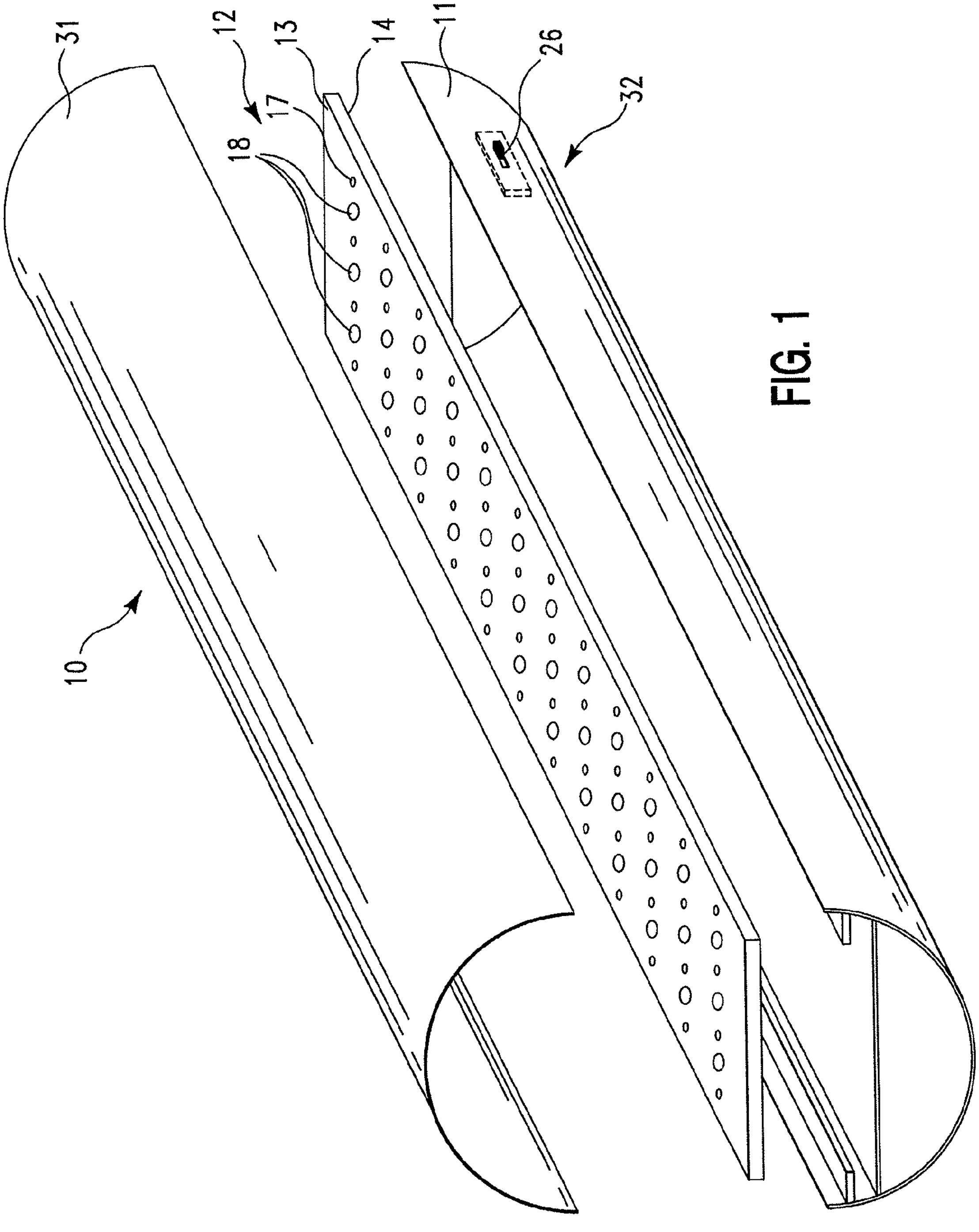
FIG. 1 is an exploded, perspective view of a portion of the tubular LED lighting fixture of the present invention.
Figure 2:
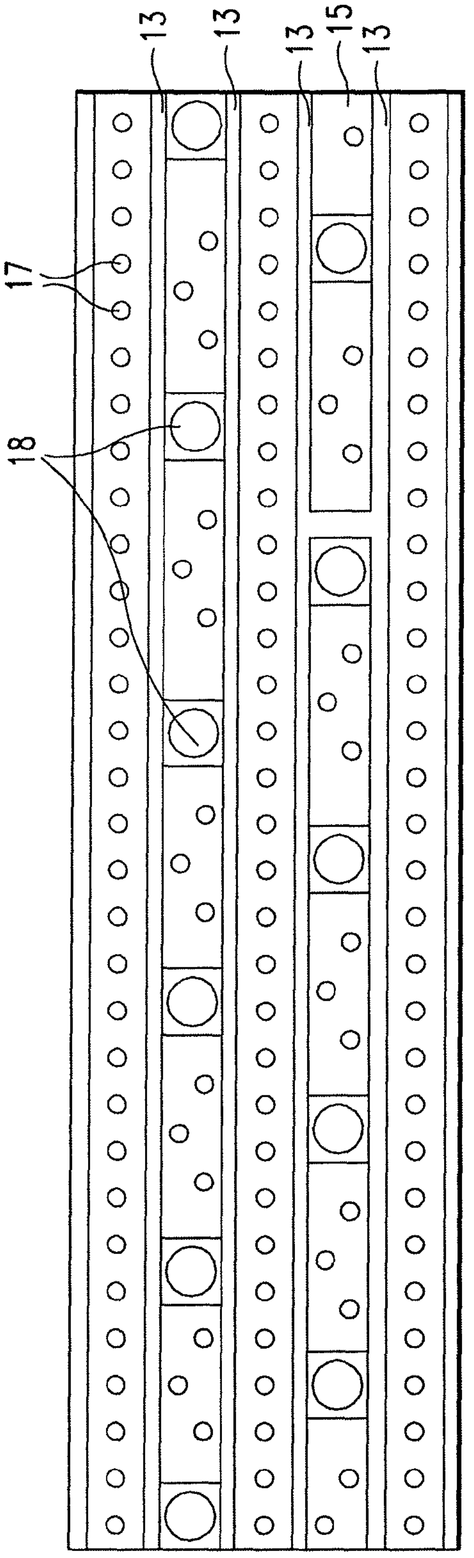
FIG. 2 is a diagrammatic, top view of the printed circuit board of the LED lighting fixture.
Figure 3:
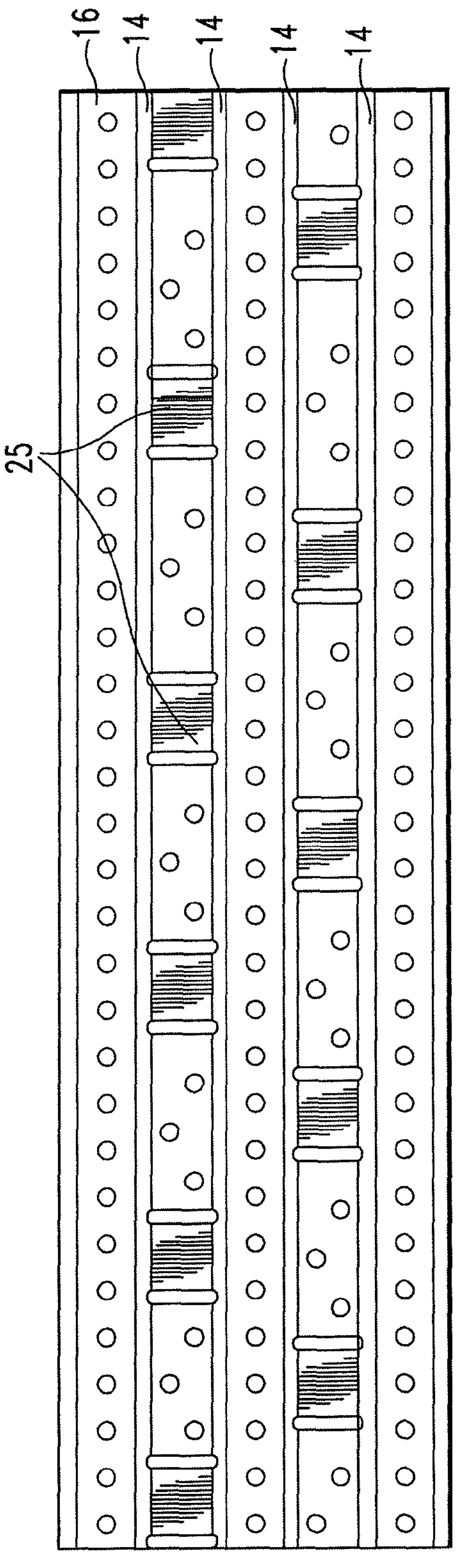
FIG. 3 is a diagrammatic, bottom view of the printed circuit board of the LED lighting fixture.
Figure 4:
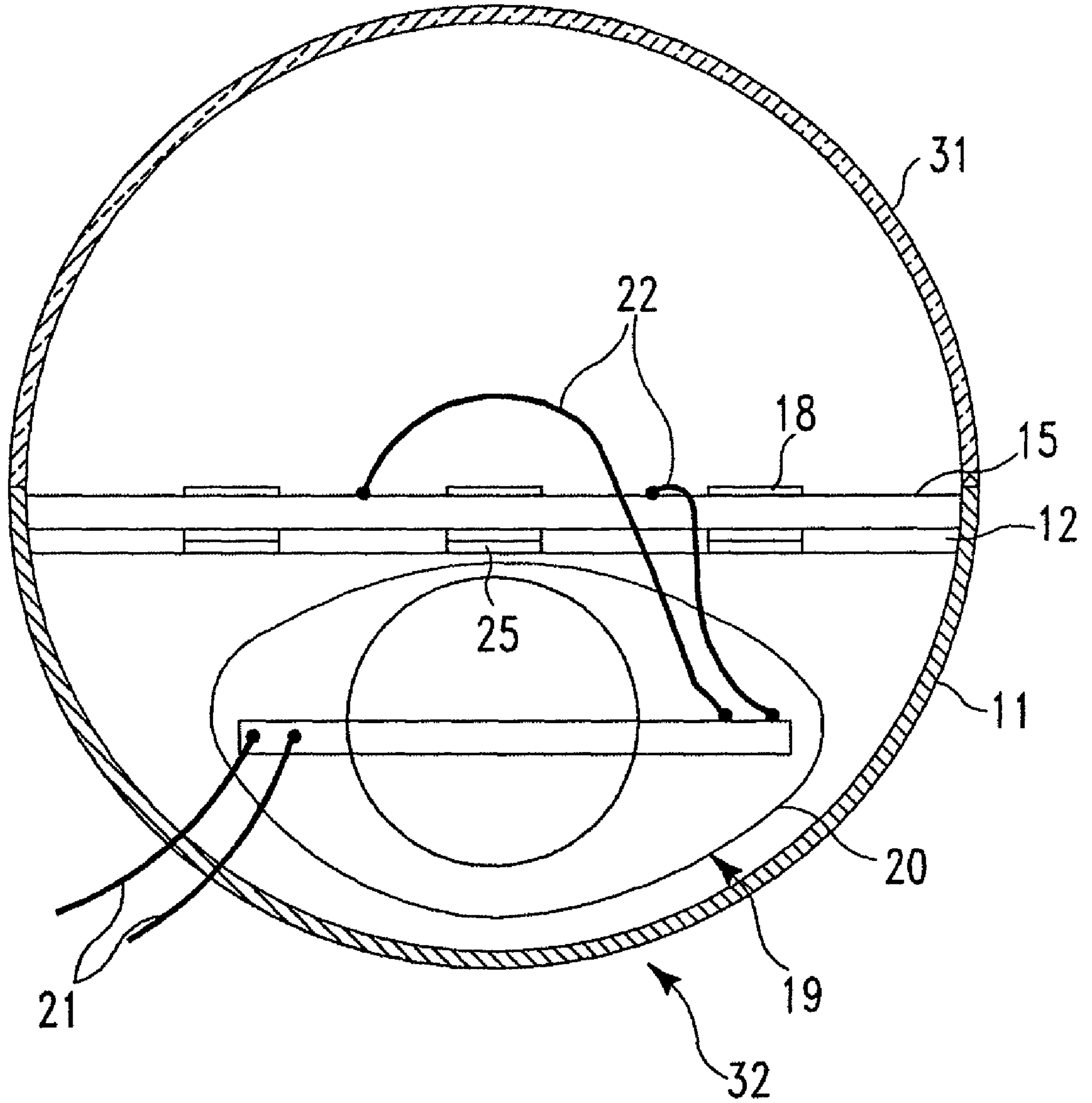
FIG. 4 is an enlarged, diagrammatic sectional view showing the fixture's driver circuit and wiring.

Referring now to FIG. 1 of the drawing an LED (light emitting diode) lighting fixture 10 is seen as comprising: a shell or extrusion 11; a heat dispersing printed circuit board 12 supported on the shell 11 and having an upper 13 (FIGS. 1 & 2) and bottom surface 14 (FIGS. 1A & 3), longitudinally extending, interconnected, laterally spaced wiring 15 and 16 on the upper 13 and bottom 14 surfaces and transverse heat pipes 17 running through the printed circuit board 12; a plurality of LEDs 18 connected in series across the laterally spaced upper surface wiring 15 and spacedly mounted on the printed circuit board 12; a high frequency electronic driver 19 (FIGS. 1A & 4) embedded within an insulating jacket 20 and mounted in the shell 11, with input wires 21 leading into the driver 19 from an external DC power source and feed wiring 22 leading from the driver 19 to the upper wiring 15 for the LEDs 18, the driver 19 being connected in series with the LEDs 18; voltage limiting devices 25 mounted across the laterally spaced bottom surface wiring 16 and in parallel with the LEDs 18; a lens 31 bonded to the shell 11 and covering the printed circuit board 12 for directing and delivering light from the LEDs 18, the shell 11 and lens 31 forming a tube 32 for enclosing the LED bearing printed circuit board 12; the tube 32 so formed having sealed ends 33 (FIGS. 1A and 5) to form a watertight, LED tubular lighting fixture 10.

The input wires 21 and other wiring extend through at least one sealed end 33 of the tube 32 to a connector 34. Connector 34 (FIG. 1A) is ultimately wired to a dc power supply.

The shell or extrusion 11, typically aluminum, provides structural support for the printed circuit board 12 and also acts as a heat sink for the heat generated on the printed circuit board 12. It provides extremely high thermal dissipation for the LEDs 18 and gives extremely low junction temperature and extended service life. Board 12 slides in from one end of the extrusion 11 and in this way, when and if necessary, boards may be replaced within the tube 32.

The rigid printed circuit board 12, typically made from regular fiberglass material products, is very resilient to shock and is held rigid by the extrusion 11.

Its heat pipes 17 that go through the board 12, normally less than a millimeter in diameter, allow localized heat build-up around the LED chips 18 to circulate around the circuit board 12 and thus cool down the entire LED chip array. The wiring 15, 16 on the upper 13 and bottom 14 surfaces of the board 12, which are interconnected, is typically copper.

The LEDs 18 are readily available surface mount devices, typically 3 millimeters square, die type F12310SA-BL(A) that are soldered to the upper wiring or bus 13 on the printed circuit board 12. Surface mount LEDs 18 have a reduced heat load and distribute the light across the whole surface of the printed circuit board 12 and thereby contribute to linearity. The type of chip selected helps to distribute the light evenly across the whole length of the tube to be formed. This, in turn, leads to a uniform light path on a surface to be illuminated, e.g., wall, ceiling or floor.

The high frequency electronic driver 19 controls the drive current to the LEDs 18 from their DC supply and ensures that the LEDs 18 reach their maximum life and maintain steady light output. It has the side benefit of allowing the bus to operate at above the rated output thus ensuring less voltage drop down the cable.

The voltage limiting devices 25, e.g., Zener diodes, mounted on the bottom surface 14 of the printed circuit board 12 and in parallel with the LEDs 18 serve to precisely regulate voltage across the LED die.

Tube 32 may include an on-off switch 26 that would be wired into the positive lead to the driver 19 and mounted in the extrusion 11 to allow individual switching on and off of a tube.

The transparent lens 31 is to distribute light evenly across a field, is typically ⅛" thick, ribbed on the interior with curvature of 120 degrees and made of impact resistant polycarbonate material. The lens 31 is joined to the extrusion 11 with a sealant, typically silicone. It seals and protects the LEDs 18, making them dirt, water and vandal proof The lens 31 may also be made opaque like, for example, a fluorescent tube, by doping the polycarbonate material with a bit of titanium oxide to make it white, in which case the lens 31 functions also as a diffuser.

Figure 1A:
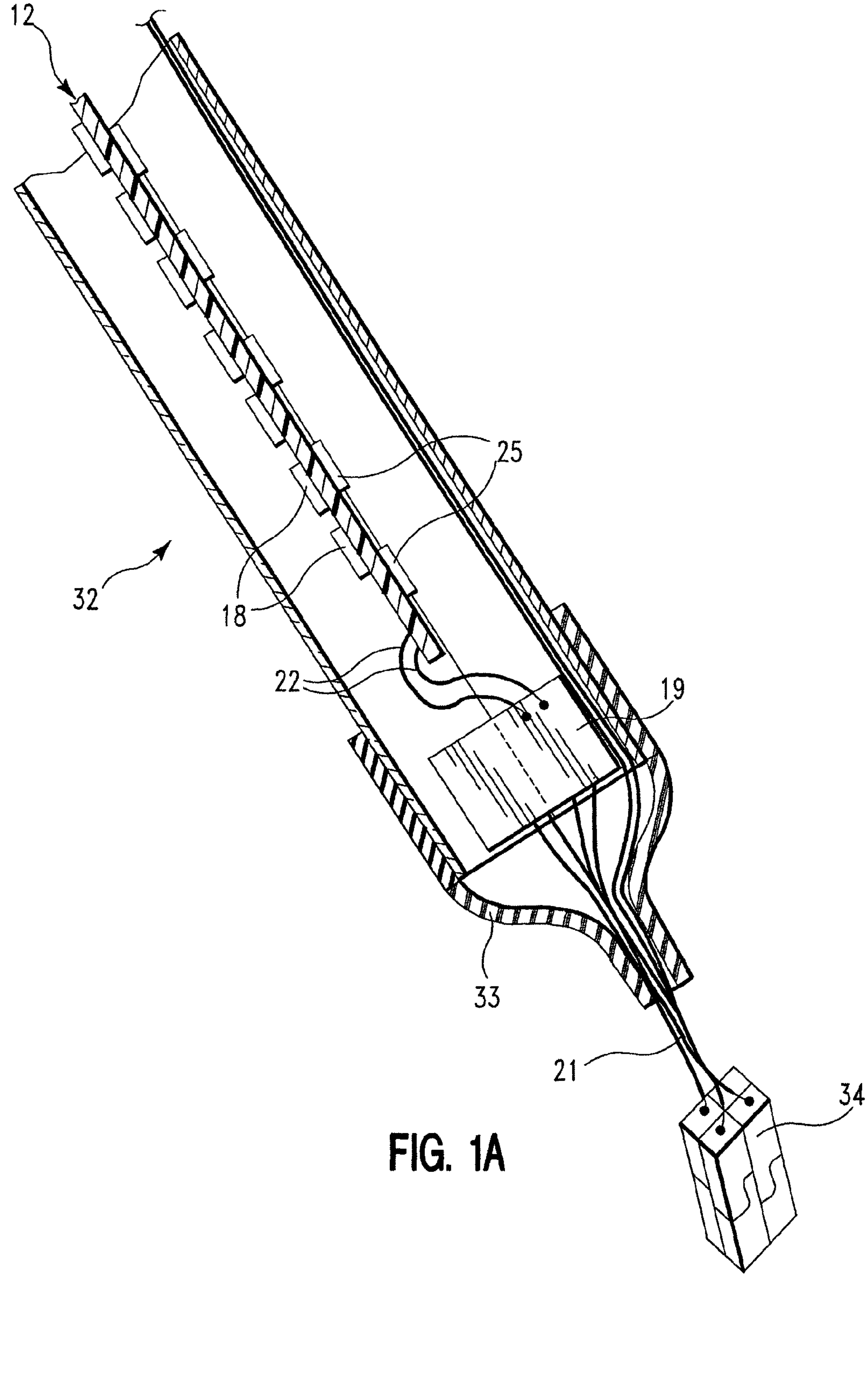
FIG. 1A is a side sectional view of a portion of the tubular LED lighting fixture wired to a connector.
Figure 5:
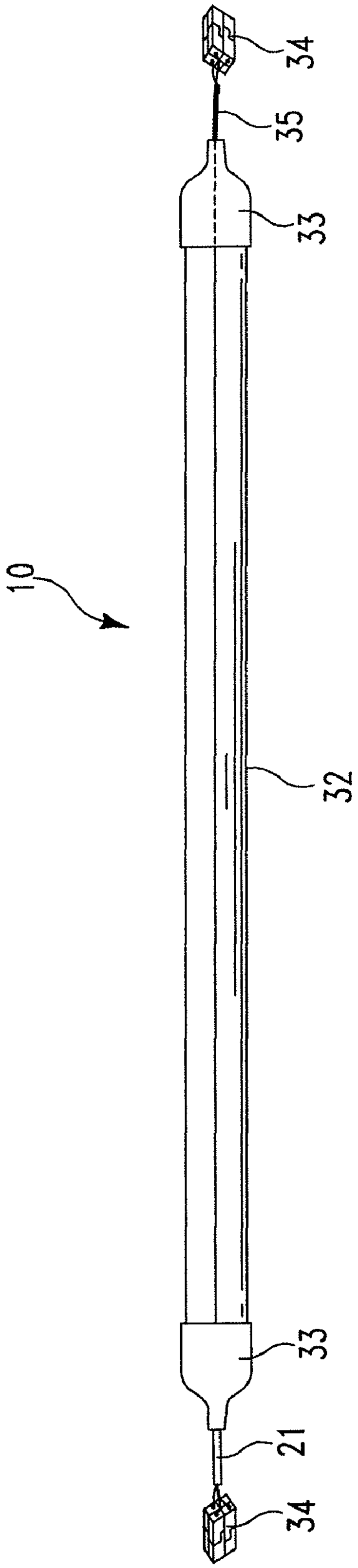
FIG. 5 is a perspective view of a completed LED tubular lighting fixture wired to connectors.

The extrusion 11 and lens 31, together form a tube 32, the ends of which are sealed with an adhesive lined heat-shrink tubing 33 (FIGS. 1A and 5). A connector 34 at one end of the tube 32 is joined to the wiring 21 leading to the driver 19. A cable 35 at the opposite end of the tube that is electrically connected to the circuitry at the end of the printed circuit board 12 within tube 32 leads to another connector 34 that, in turn may lead to another tube 32. Alternatively, the circuitry may be terminated within the tube 32 where only one tube 32 is to be powered. More than one board can be wired within a single tube and be separately energized, if desired, such as in a bi-level mode.

Figure 6:
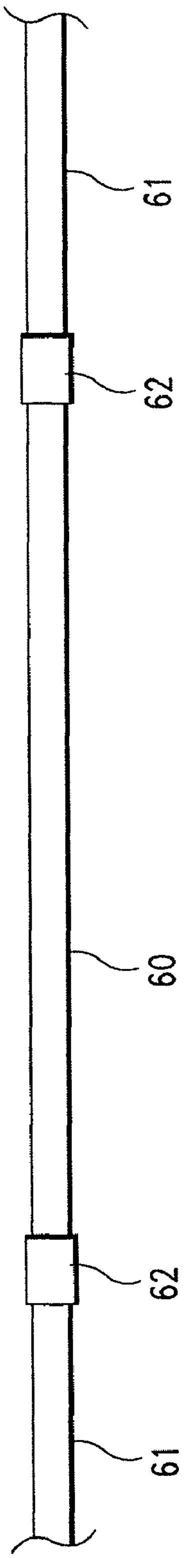
FIG. 6 is a diagrammatic view of a portion of a lighting system for a building where LED lighting fixtures are sealed between conduits.

Referring to FIG. 6, a portion of an LED system is shown for a building or structure. It may be formed by sealing an LED tubular fixture 60 into conduits 61 for example, ¾ inch schedule 40 plastic conduit, with couplers 62 at the juncture location between tube 60 and conduit 61.

The tube 60 and conduit 61 are essentially the same diameter. Only one tube 60 is shown, but any number of fixtures can be included in the system. Cabling to the fixtures runs through the conduit to a power source. Since the fixture is powered by a low voltage DC source, the danger of running high voltage current through narrow plastic conduit is eliminated. Additionally, with this system, existing track light systems can be replaced with greatly reduced energy and maintenance costs. The system can be operated over existing wiring, where desired, so wholesale rewiring is not required.

Figure 7:
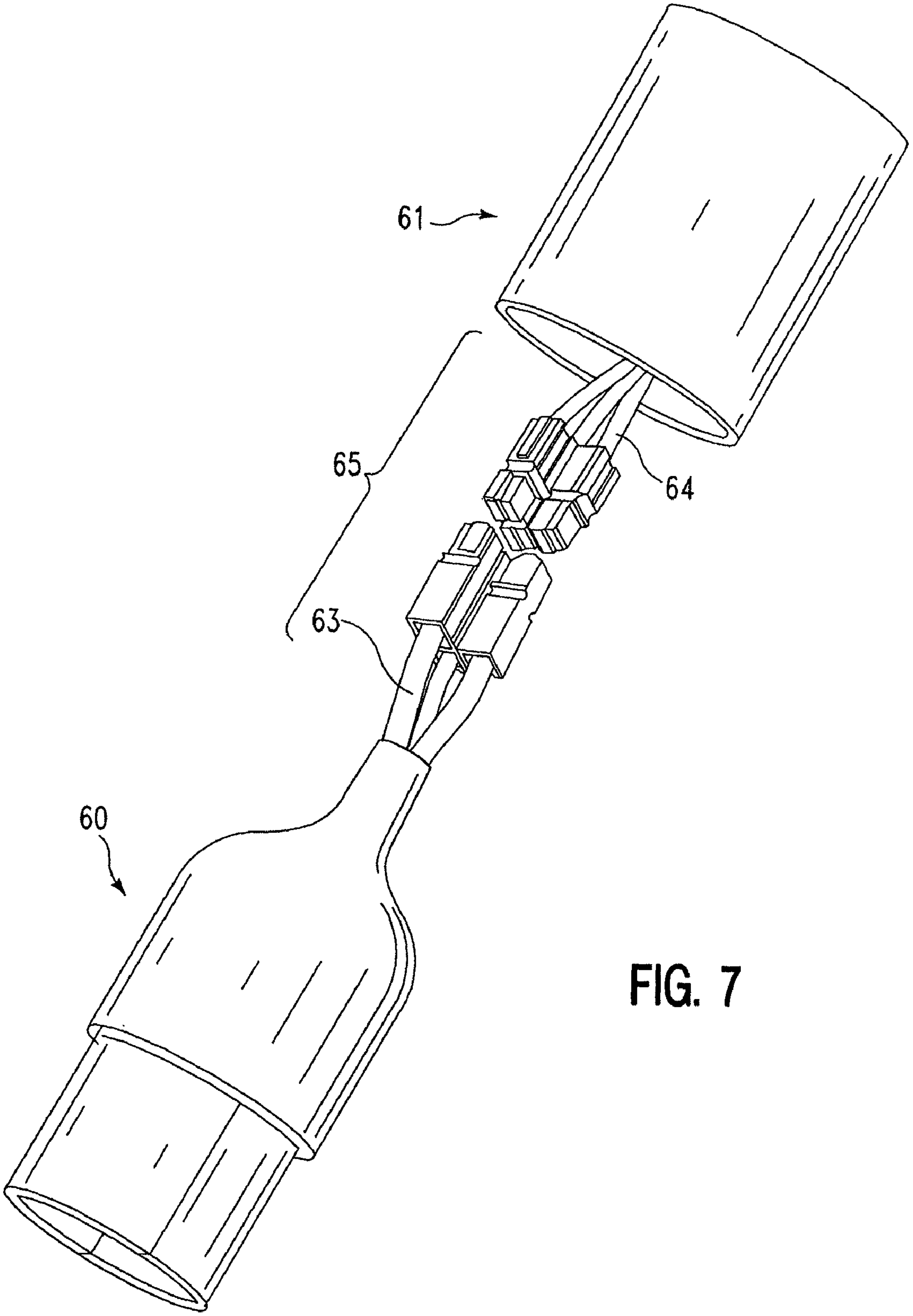
FIG. 7 is a perspective view of a portion of a tubular LED lighting fixture adapted for wiring to a connector.

FIG. 7 is an exploded cutaway view illustrating the interconnection of the wiring 63 of an LED tubular fixture 60 to cabling 64 through conduit 61 via connector 65.

Figure 8:
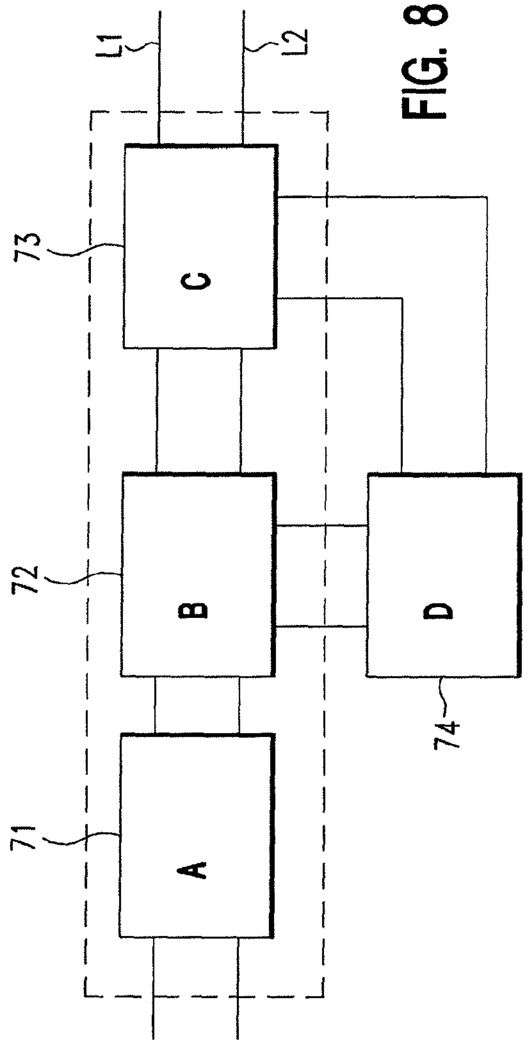
FIG. 8 is a circuit diagram for the power to energize all of the LED devices in an array of devices.
Figure 9:
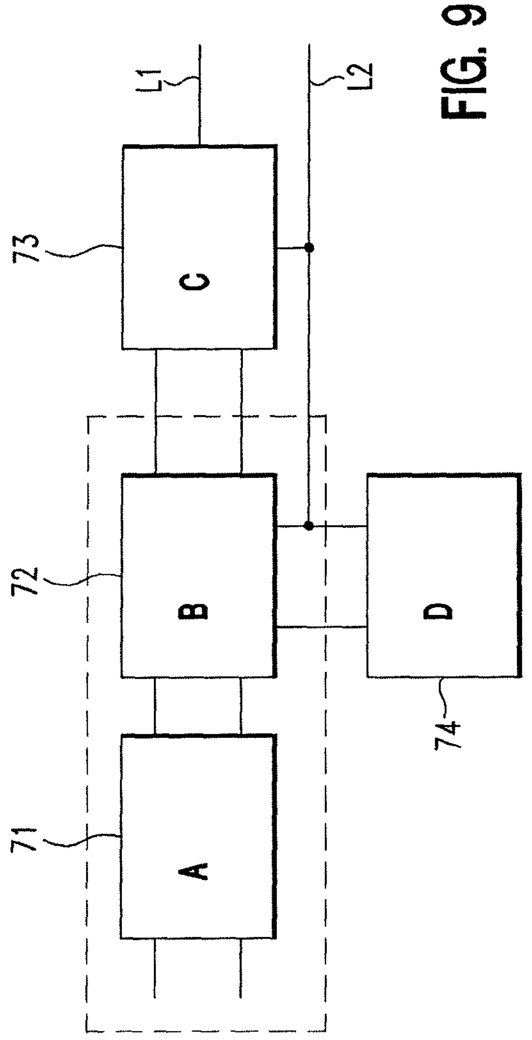
FIG. 9 is a circuit diagram for the power to energize selected ones of a plurality of LED tubular lighting fixtures.

The circuit arrangement shown by the diagram in FIG. 8 is for energizing all of the LED devices in an array of devices, with one of the lead lines L1, being connected to all the LED fixtures, not just to a single or selected LED fixture as in FIG. 9, that follows.

FIG. 9 is a circuit diagram for the power to energize selected ones of a plurality of LED tubular lighting fixtures. In a typical embodiment, AC power is fed to an industry standard AC-DC converter 71 that acts as the power source to the fixture. Typically, the fixture is powered by a 24 volt DC operating voltage. The typical ac line voltage of 115 is transformed to the DC voltage. The output from converter 71 is fed to battery charger 72, thence through a relay 73 to an LED fixture via lead lines L1, L2. A trickling charge is provided from charger 72 to a battery back-up 74. In normal operation, the LED fixture is powered from converter 71. In the event that power from converter 71 is removed intentionally or due to a power failure, relay 73 is activated to direct power to the LED fixture from battery back-up 74. This particular arrangement is utilized for a single LED fixture or a selected one of a plurality of LED fixtures.

Figure 10:
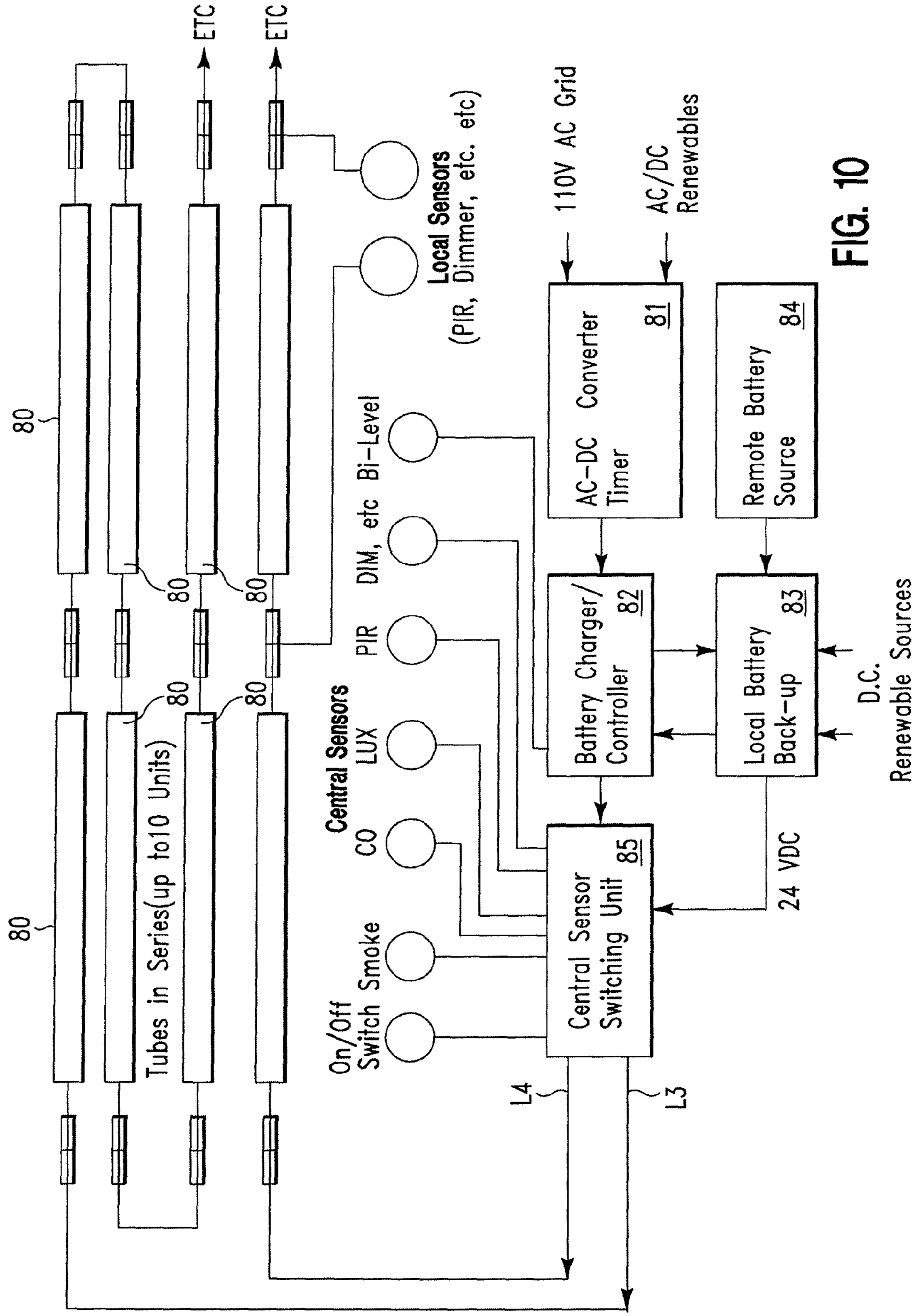
FIG. 10 is a schematic circuit diagram of an LED lighting system, utilizing various power inputs and controls.

FIG. 10 is a schematic circuit diagram of an LED lighting system, utilizing various power inputs and controls. 110V AC power is fed to a unit 81 that includes an AC-DC converter that acts as a power source. The converter may also be powered by other AC/DC renewables such as wind, solar or hydropower. Unit 81 also includes a timer unit that is timed to access the power grid at those times when utilities charge for power at a lower kilowatt rate such as in the early morning hours. The output from unit 81 is fed to a battery charger/controller 82. A trickling charge is provided from battery charger/controller 82 to a local battery bank 83. Output from unit 81 could be operated with a bus voltage at 28 volts to allow for charging the back-up battery system 83. The local battery bank 83 may also be powered from a large, remote battery storage source 84 or other remote DC renewable sources such as photovoltaics.

In normal operation a central sensor switching unit 85 is powered from unit 81 through battery controller 82 and thence onto a plurality of series connected LED fixtures 80 via leads L3.

Figure 11:
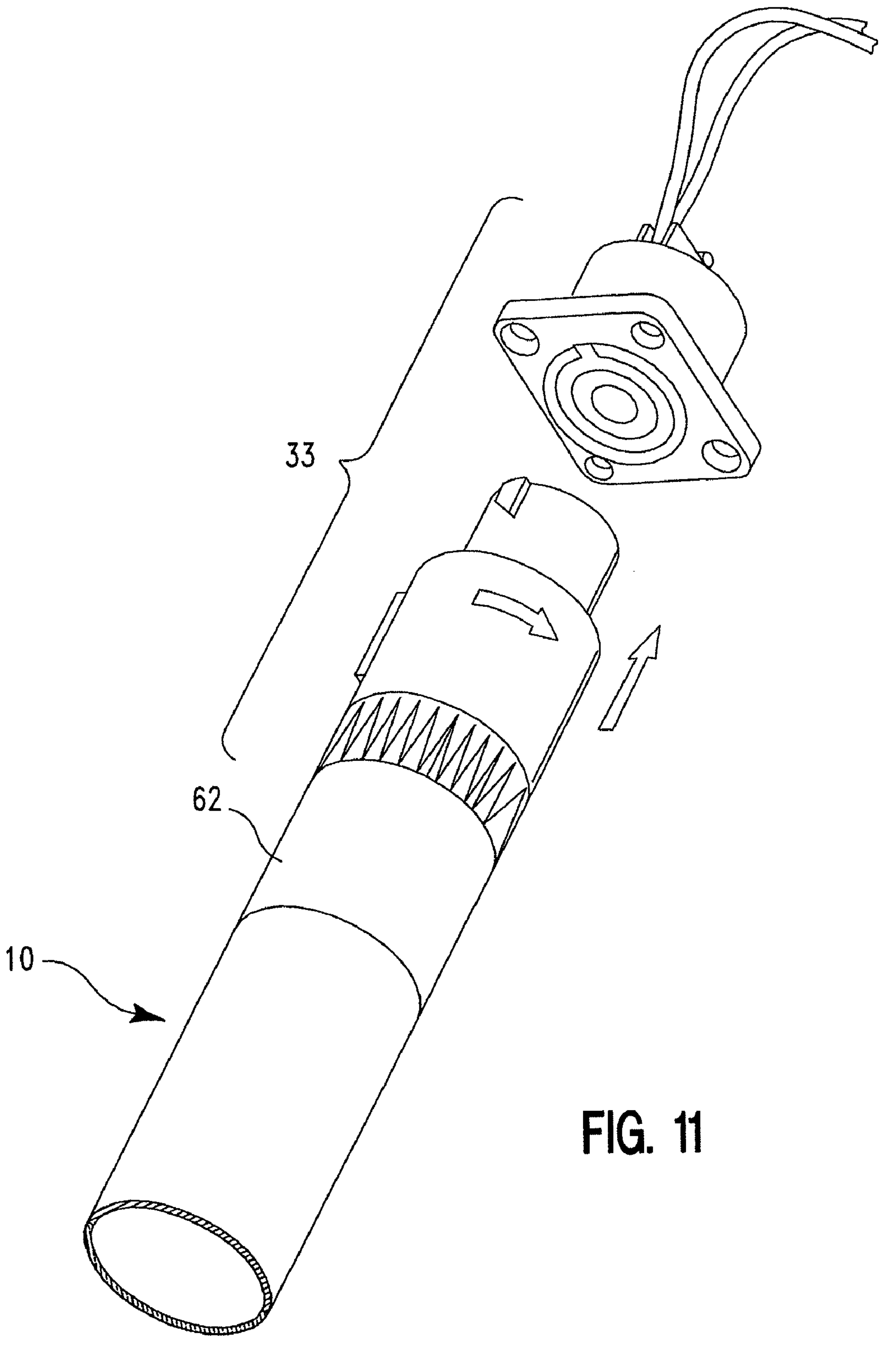
FIG. 11 is a perspective, exploded view, illustrating a stand-alone tubular LED lighting fixture inserted and held within a connector; and, FIG. 12 is a schematic circuit diagram allowing 24 or 48 application.

Unit 85 includes an on-off switch and may also include a plurality of control modules to effect, motion sensing, daylight sensing, PIR, dimming, bi-level control, etc. The controls could be extended to currently available detectors, e.g., smoke, CO, etc. that would provide a failsafe emergency illumination system as part of the general illumination structure of an entire building at little or no additional cost. In the event power is removed from unit 81, either intentionally or due to a power failure, power will be furnished either to the entire system of fixtures 80 from local battery source 83 via leads L3 or to a limited back-up set of fixtures 80 via leads L4. The limited back-up set of fixtures may also have a local set of sensors. These fixtures can be positioned anywhere within the system utilizing the same conduit. FIG. 11 illustrates a stand-alone tubular LED lighting fixture 91 inserted and held within a connector 92 such as a Speakeron NL4, produced by Neutrik or a Cliffcon 4PC made by CliffUK.

Figure 12:
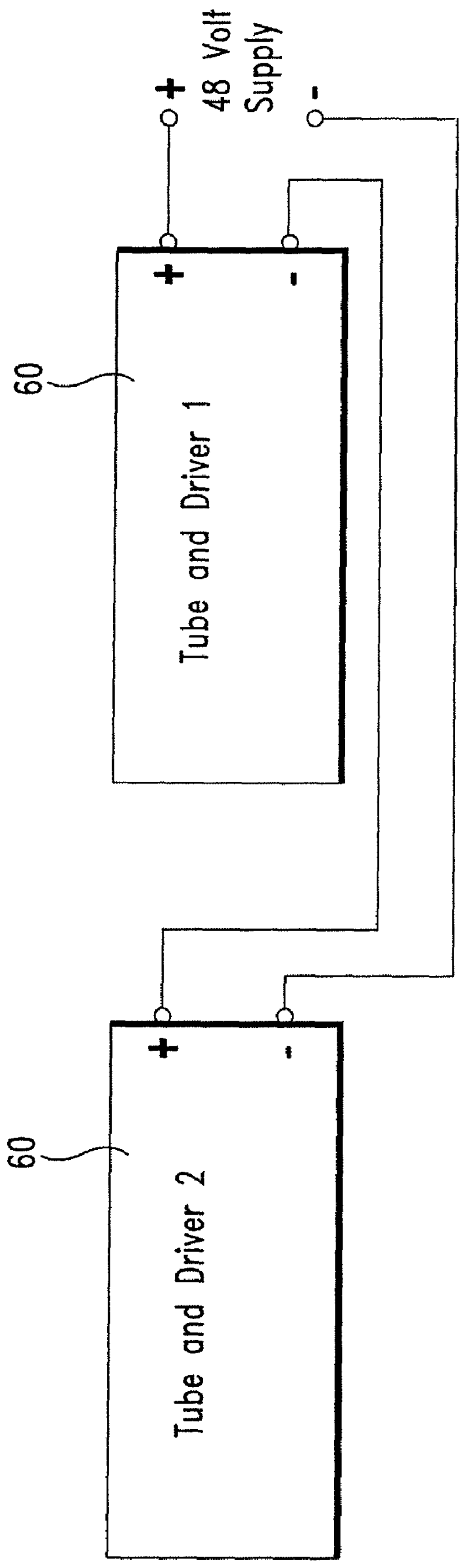

In the circuit arrangement of FIG. 12, with two 24 volt LED tubes 60 together in a series configuration, 48 volt operation is possible, allowing for widespread deployment of the system in existing or new battery back-up installations. Because this system with its LED lighting offers such a low load, it will be possible to remove much of the household and commercial lighting load from the national power grid. This low load, for instance, would reduce the size of a photovoltaic or wind turbine power source to an economically viable size due to the up to 80% reduction in load over conventional light sources.

Therefore, permanent battery backup of such a system is feasible (i.e. charge by day, discharge by night).

The tubular lighting fixture could be plugged into a water tight connector connected to small storage batteries and energized by a solar panel, thus providing low cost lighting that could be deployed anywhere in the world such as in mobile applications. The plug-in tubular lighting fixture could also be used for replacement of track lighting, in retail shops, art museums, etc.

The advantages of the LED tubular lighting fixture and its incorporation onto various systems are many fold. Operation is with low voltage DC power and can, in many cases, use existing wiring. The fixture provides efficient illumination and reduces power consumption and space requirements. It is cool in operation, with reduced heat generation. The fixture is very rugged and operable over a wide range of temperatures The fixture is designed to operate between −40 and +50 degrees Centigrade and in areas of high humidity and/or abrasive particulates.

It should be obvious that changes, additions and omissions may be made in the details and arrangement of parts without departing from the spirit and scope of the invention as hereinafter claimed.

What is claimed is:

1. A tubular LED lighting fixture comprising:
- a heat sink shell;
- a printed circuit board having only its longitudinal edges supported on the shell and having
  - wiring on the board
- a plurality of LEDs connected in series to the wiring and spacedly mounted along the printed circuit board;
- openings in the printed circuit board spaced from the LEDs;
- a high frequency electronic driver connected in series with the LEDs and adapted to be connected to a DC power source;
- a plurality of voltage limiting devices connected to the wiring and a device in parallel with each of the LEDs; and,
- a lens bonded to the shell covering the printed circuit board for directing and delivering light from the LEDs,
- the shell and lens forming a tube for enclosing the LED bearing printed circuit board, the tube forming a watertight fixture.

2. The fixture of claim 1 wherein the printed circuit board has an upper surface, longitudinally extending laterally spaced wiring on the upper surface, the plurality of LEDs being connected in series across the laterally spaced upper surface wiring.

3. The fixture of claim 1 wherein the printed circuit board has longitudinally extending laterally spaced wiring on the bottom surface, the voltage limiting devices being mounted across the laterally spaced bottom surface wiring in parallel with the LEDs.

4. The fixture of claim 1 wherein the LEDs are surface mounted devices.

5. The fixture of claim 1 wherein the voltage limiting devices are Zener diodes.

6. The fixture of claim 1 wherein the high frequency electronic driver is mounted in the shell.

7. The fixture of claim 1 wherein the lens is transparent.

8. The fixture of claim 1 wherein the lens is opaque.

9. The lens of claim 1 wherein the lens has a wide angle of at least 120 degrees.

10. The fixture of claim 1 wherein the tube has sealed ends.

11. The fixture of claim 10 including input wires extending from the high frequency electronic driver through at least one of the tube sealed ends.

12. A tubular LED lighting fixture comprising:
- a heat sink shell;
- a printed circuit board having only its longitudinal edges supported on the shell and having
  - an upper surface and a bottom surface,
  - longitudinally extending laterally spaced wiring on the upper and bottom surfaces
- a plurality of LEDs connected in series across the laterally spaced upper surface wiring and spacedly mounted along the printed circuit board;
- openings in the printed circuit board spaced from the LEDs;
- a high frequency electronic driver mounted in the shell and connected in series with the LEDs;
- a plurality of voltage limiting devices mounted across the laterally spaced bottom surface wiring of the printed circuit board and a device in parallel with each of the LEDs;
- a lens bonded to the shell covering the printed circuit board for directing and delivering light from the LEDs,
- the shell and lens forming a tube for enclosing the LED bearing printed circuit board;
- the tube so formed having sealed ends to form a watertight fixture; and,
- input wires extending from the high frequency electronic driver through at least one of the tube sealed ends.

* * * * *